(12) United States Patent
Haneda et al.

(10) Patent No.: US 7,075,755 B2
(45) Date of Patent: Jul. 11, 2006

(54) MAGNETO-RESISTANCE EFFECT ELEMENT WITH MAGNETISM SENSITIVE REGION CONTROLLED BY VOLTAGE APPLIED TO GATE ELECTRODE

(75) Inventors: Shigeru Haneda, Kanagawa-Ken (JP); Yuichi Osawa, Kanagawa-Ken (JP); Shiho Nakamura, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 464 days.

(21) Appl. No.: 10/671,492

(22) Filed: Sep. 29, 2003

(65) Prior Publication Data
US 2004/0061980 A1    Apr. 1, 2004

(30) Foreign Application Priority Data
Sep. 30, 2002   (JP)   ............................. 2002-287804

(51) Int. Cl.
*G11B 5/39* (2006.01)
(52) U.S. Cl. ................................. 360/313; 360/324.12
(58) Field of Classification Search ........... 360/324.12, 360/313, 324, 320
See application file for complete search history.

(56) References Cited

U.S. PATENT DOCUMENTS

| 5,416,353 | A | 5/1995 | Kamiguchi et al. ......... 257/421 |
| 2005/0117263 | A1* | 6/2005 | Seigler ....................... 360/313 |

FOREIGN PATENT DOCUMENTS

| JP | 11-330387 | 11/1999 |
| JP | 2001-203332 | 7/2001 |

OTHER PUBLICATIONS

N. Akiba, et al., "Interlayer Exchange in (Ga, Mn) As/ (Al, Ga) As/ (Ga, Mn) As Semiconducting Ferromagnet/ Nonmagnet/Ferromagnet Trilayer Structures", Applied Physics Letters, vol. 73, No. 15, Oct. 12, 1998, pp. 2122-2124.

D. Chiba, et al., "Properties of (Ga, Mn) As/ (Al, Ga) As/ (Ga, Mn) As Magnetic Trilayer Structures", Physica E, vol. 10, 2001, pp. 278-282.

H. Ohno, et al., "Electric-Field Control of Ferromagnetism", NATURE, vol. 408, Dec. 21/28, 2000, pp. 944-946.

D. Chiba, et al., "Properties of Field-Effect Transistors with a III-V Ferromagnetic Semiconductor Channel Layer", The $7^{TH}$ Symposium on the Physics and Application of Spin-Related Phenomena in Semiconductor, vol. A7, Dec. 17-18, 2001, pp. 25-28 (Extended Abstract).

* cited by examiner

*Primary Examiner*—Julie Anne Watko
(74) *Attorney, Agent, or Firm*—Oblon, Spivak, McClelland, Maier & Neustadt, P.C.

(57) ABSTRACT

A magneto-resistance effect element of the present invention allows detection of a micro-bit signal with a high sensitivity. The magneto-resistance effect element is provided with a first magnetic substance layer, a spacer layer stacked on the first magnetic substance layer, a second magnetic substance layer stacked on the spacer, an insulating layer positioned adjacent to a stacked structure comprising the first magnetic substance layer, the spacer layer and the second magnetic substance layer, a gate electrode positioned adjacent to the insulating layer, and a magnetism sensitive region controlled by a voltage applied to the gate electrode.

19 Claims, 18 Drawing Sheets

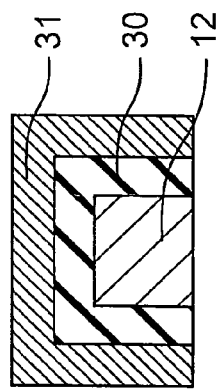
FIG. 16A
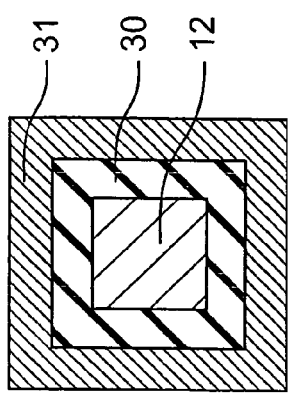
FIG. 16B
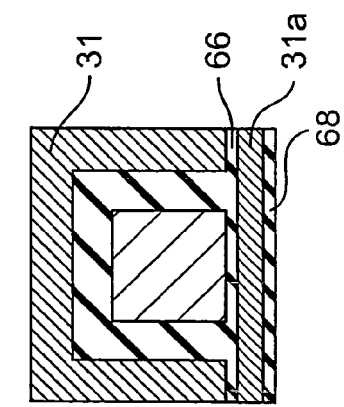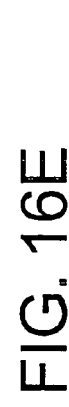
FIG. 16E
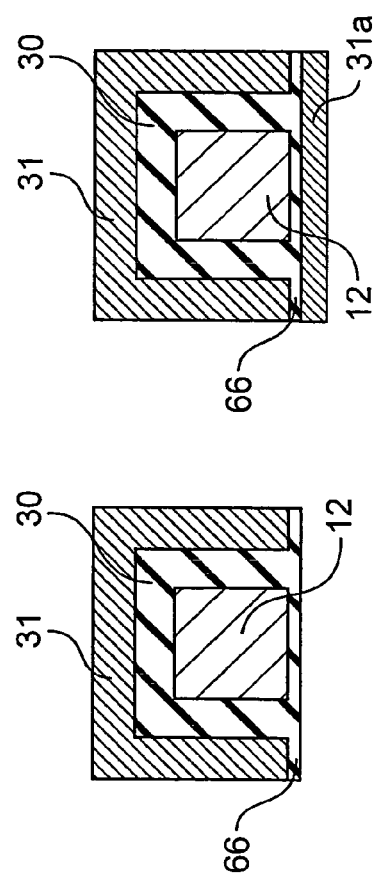
FIG. 16D
FIG. 16C

MAGNETO-RESISTANCE EFFECT ELEMENT WITH MAGNETISM SENSITIVE REGION CONTROLLED BY VOLTAGE APPLIED TO GATE ELECTRODE

CROSS-REFERENCE TO RELATED APPLICATIONS

This application is based upon and claims the benefit of priority from prior Japanese Patent Application No. 2002-287804, filed on Sep. 30, 2002 in Japan, the entire contents of which are incorporated herein by reference.

FIELD OF THE INVENTION

The present invention relates to a magneto-resistance effect element.

RELATED ART

Nowadays, according to improvement in magnetic recording density, densification of a hard disc drive is required, and research for a magnetic head using a magneto-resistance effect element which detects a micro-bit signal with a high sensitivity is being forwarded. In order to detect a micro-bit signal with a high sensitivity, it becomes necessary to reduce a size of a magnetism sensitive region of the magneto-resistance effect element.

A size control (for example, the limitation thereof is currently 150 nm) of a magnetism sensitive region in a conventional magneto-resistance effect element is conducted by forming a micro-element corresponding to a micro-bit by a stacked film thickness and working. However, since a formation size is approaching to a working limitation, element fabrication becomes difficult.

On the other hand, a magneto-resistance effect element having a three-layer structure of magnetic semiconductor/semiconductor/magnetic semiconductor which uses magnetic semiconductor including a combination of magnetic substance and semiconductor has been proposed. However, the element can not operate at a micro-region due to operation of the entire element (for example, refer to N. Akiba et al.: phys. Lett., 73, 2122 (1998), D. Chiba et al.: Physical E, 10, 278 (2061)).

Further, regarding group III–V thin magnetic semiconductor (In, Mn)As or (Ga, Mn)As, there is such a report that magnetization state of magnetic semiconductor has been controlled by conducting control on carrier density externally according an FET action. However, since magnetization of the entire element is controlled, operation at a micro-region is impossible (for example, refer to H. Ohno et al.: Nature, 408, 944 (2000), D. Chiba et al.: Extended Abstracts of the $7^{th}$ symposium on the PASPS, A7, p25 (2001)).

A magneto-resistance effect element utilizing a magnetic substance layer and a semiconductor layer has been known (for example, refer to Japanese Patent No. 3253696). Since the element is also an element utilizing a magneto-resistance effect of the entire element, operation at a micro-region is impossible. Further, a structure where a magnetized region has been divided by a spacer layer has been known (for example, refer to Japanese Patent Laid-Open No. 11-330387). In this structure, since change of magnetic interaction between magnetic regions conducted by external simulation to the spacer layer is used for magnetization control on the magnetic regions, a function serving as a magneto-resistance effect element is not provided.

However, controlling a size of a magnetism sensitive region of a magneto-resistance effect element is an effective technique for not only a head application but also detection of a micro-bit signal with a high sensitivity, but it has not been put in a practical use yet.

SUMMARY OF THE INVENTION

The present invention has been made in view of the above-described circumstances, and an object thereof is to provide a magneto-resistance effect element which can detect a micro-bit signal with a high sensitivity.

A magneto-resistance effect element according to an aspect of the present invention includes: a first magnetic substance layer; a spacer layer stacked on the first magnetic substance layer; a second magnetic substance layer stacked on the spacer layer; an insulating layer positioned adjacent to a stacked structure comprising the first magnetic substance layer, the spacer layer and the second magnetic substance layer; a gate electrode positioned adjacent to the insulating layer, and a magnetism sensitive region controlled by a voltage applied to the gate electrode.

The size of the magnetism sensitive region of at least one of the first and second magnetic substance layers can be changed by the voltage applied to the gate electrode.

The magnetism sensitive region can be narrowed.

The conductive region can be narrowed.

The magnetic substance layer whose magnetism sensitive region is changed by the voltage applied to the gate electrode can include at least one of group III–V semiconductor crystal, group II–VI semiconductor crystal, group IV semiconductor crystal, chalcopyrite semiconductor crystal and amorphous semiconductor crystal as a base material, and include at least one of a transition metal element and a rare earth metal element as a magnetic element.

The spacer layer can be formed of group III–V semiconductor crystal, group II–VI semiconductor crystal, group IV semiconductor crystal, chalcopyrite semiconductor crystal or amorphous semiconductor crystal.

BRIEF DESCRIPTION OF THE DRAWINGS

FIG. 16A to FIG. 16E are sectional views for explaining manufacturing steps of a portion of a magneto-resistance effect element according to one embodiment of the present invention which is positioned near a free layer thereof;

EMBODIMENTS OF THE INVENTION

Embodiments of the present invention will be explained in detail with reference to the accompanying drawings.

(First Embodiment)

Figure 1A:
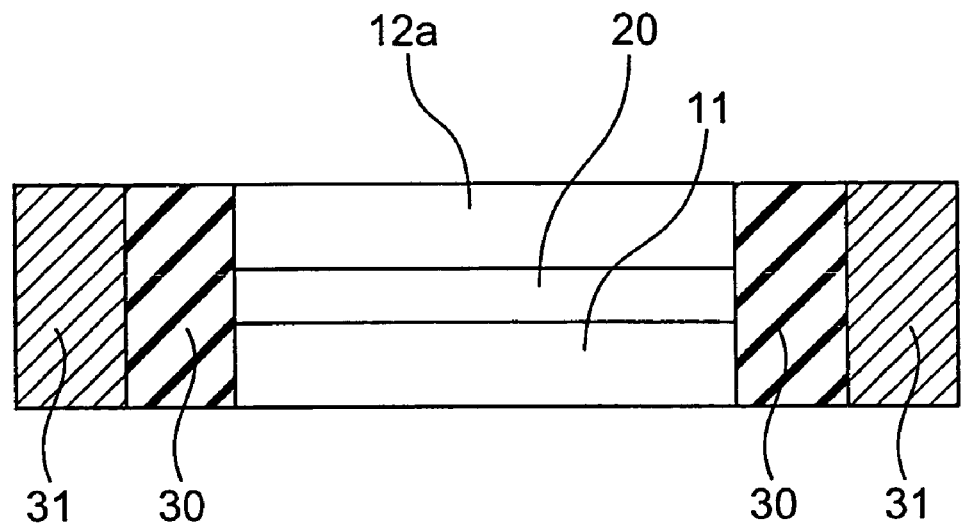
FIG. 1A is a sectional view showing a constitution of a magneto-resistance effect element according to a first embodiment of the present invention.

A constitution of a magneto-resistance effect element according to a first embodiment of the present invention will be shown in FIG. 1A. A magneto-resistance effect element according to this embodiment includes a stacked structure body constituted by stacking a magnetic substance layer 11 comprising ferromagnetic substance, a spacer layer 20, and a magnetic semiconductor layer 12a, and it has a constitution that gate electrodes 31 are provided around the stacked structure body via insulator layers 30. A magneto-resistance effect element with such a stacked structure body having the gate electrodes 31 is constituted so as to change a magnetization state of the magnetic semiconductor layer 12a according to a voltage applied to the gate electrodes 31 to control a size of a magnetism sensitive region. For example, in FIG. 1B, when a positive voltage is applied to the gate electrode 31, valence band holes contained in the magnetic semiconductor layer 12a congregate in a region of a central portion, while conductive band electrons congregate in end portion regions. At that time, the central portion in which the valence band holes congregate is changed to a ferromagnetic state 13a and the end portion regions in which the conductive band electrons congregate are changed to a paramagnetic state 13b. Therefore, carrier density in the magnetic semiconductor layer 12a can be controlled by controlling a voltage applied to the gate electrode 31, so that carrier density in the magnetic semiconductor layer 12a can be controlled to one of the ferromagnetic state 13a and the paramagnetic state 13b. The width of the magnetic semiconductor layer 12a is about 150 nm, and the width conventionally constitutes a magnetism sensitive region. In this embodiment, however, the region 13a changed to the ferromagnetic state is about 1/3 the width of the magnetic semiconductor layer 12a, namely, about 50 nm. Thereby, it can be made easy to reduce (narrow) the size of the magnetism sensitive region in a direction of magnetic field as compared with the conventional case, so that a micro-bit signal can be detected with a high sensitivity. Incidentally, FIG. 1A shows a state that no voltage is applied to a gate, where the magnetic semiconductor layer 12a has been changed to the ferromagnetic state.

In the magnetic semiconductor layer 12a used in this embodiment, semiconductor constituting a main body may be materials where a predetermined density of carrier can be produced/varnished by the external electrical field, and it may be magnetic semiconductor whose magnetized state can be controlled by carrier density, from the viewpoint of the semiconductor characteristics.

Typical semiconductors include group III–V semiconductor, group II–VI semiconductor, group IV semiconductor, chalcopyrite semiconductor and amorphous base semiconductor. However, since the semiconductors are required to meet only the above-described magnetic semiconductor characteristics and magnetized state, they are not limited to these semiconductor crystals. For example, in the group III–V semiconductor crystals, GaAs, GaN, GaP, GaSb, AlAs, AlN, AlP, AlSb, InAs, InN, InP, InSb, mixed crystals thereof and the like can be used. In the group II–VI semiconductor crystals, ZnSe, MgSe, CdSe, BeSe, ZnS, MgS, CdS, BeS, ZnTe, MgTe, CdTe, BeTe, ZnO, MgO, CdO, BeO, mixed crystals thereof and the like can be used. In the group IV semiconductor crystals, Si, Ge, C and the like can be used. In the chalcopyrite semiconductor crystals, $CdGeP_2$, $CdSnP_2$, $CdSiP_2$, $ZnGeP_2$, $ZnSnP_2$, $ZnSiP_2$, $CdGeAs_2$, $CdSnAs_2$, $CdSiAs_2$, $ZnGeAs_2$, $ZnSnAs_2$, $ZnSiAs_2$, $CuAlS_2$, $CuGaS_2$, $CuInS_2$, $AgAlS_2$, $AgGaS_2$, $AgInS_2$, $CuAlSe_2$, $CuGaSe_2$, $CuInSe_2$, $AgAlSe_2$, $AgGaSe_2$, $AgInSe_2$, $CuAlTe_2$, $CuGaTe_2$, $CuInTe_2$, $AgAlTe_2$, $AgGaTe_2$, $AgInTe_2$ and the like can be used. In the amorphous base semiconductor, amorphous Si, amorphous Ge, amorphous semiconductor compound and the like can be used.

Among them, GaAs, InAs, GaP, InP, InSb, GaN and mixed crystals thereof are desirable in the group III–V semiconductor, ZnSe, CdTe, CdS, ZnO and mixed crystals thereof are desirable in the group II–VI semiconductor crystals, and CdGeP$_2$, ZnGeP$_2$ and the like are desirable in the chalcopyrite semiconductor crystals. Further, besides these group semiconductor crystals, group VI semiconductors (Se, Te and the like), group IV–VI semiconductors (PbS, PbSe, PbTe and the like) and organic semiconductors (C$_{60}$ fullerene, anthracene, polyacetylene, polyne and the like) can, of course, be used as long as they meet the above-described magnetic semiconductor characteristics and magnetized state.

As magnetic elements included in the magnetic semiconductors, there are transition metal elements and rare earth metal elements. However, since the magnetic elements are required to meet only the above-described semiconductor characteristics and magnetization state, they are not limited to the transition metal elements and rare earth metal elements.

It is preferable that such a magnetic element includes V, Cr, Mn, Fe, Co, Ni or another transition metal elements, Sc, Y or the like of group IIIa, or rare earth metal element such as lanthanoid such as Ce, Er or the like.

Further, as the above-described magnetic element, of course, materials including both the above-described transition metal element and the above-described rare earth metal are desirable. The magnetic element is actually selected in view of crystal alignment inside the semiconductor crystal serving as the main body and achievement of a desired magnetism.

Accordingly, a specific combination of a semiconductor crystal and magnetic element to be produced to a mixed crystal as magnetic semiconductor can be properly selected by evaluating the combination totally in view of a carrier density which can be produced/varnished by electric field or magnetism which can be expected. For example, there are combinations of GaN and Mn, GaAs and Mn, GaAs and Cr, CdGeP$_2$ and Mn, ZnGeP$_2$ and Mn, Si and Ce, Si and Er, and the like, but the combinations are not limited to these combinations.

In the case of the embodiment, material for the spacer layer 20 may be the above-described semiconductor crystals, or non-magnetic metals, but it is not limited to specific ones. Further, material for the magnetic substance layer 11 may be the above-described magnetic semiconductor or ferromagnetic metal, and it may be alloy or compound including the above-described magnetic element and not limited to specific one. However, as the material for the spacer layer, material which does not destroy interface shapes between the magnetic substance layers 11 and the magnetic semiconductor layer 12a, and the spacer layer 20 can be used.

In control on a magnetism sensitive region size of the magneto-resistance effect element using the gate electrodes according to the embodiment, since the magnetism of the magnetic semiconductor layer 12a depends on the carrier density and the density of the magnetic element, a combination of the semiconductor crystal and the magnetic element is not limited to a specific one, but it can be properly selected on the basis of total evaluation from the above-described point of view. In particular, it is preferable that a combination of GaN (group III–V semiconductor crystal) whose carrier density can be controlled in a broad range and Mn element which can develop ferromagnetism in a broad temperature range including a room temperature is used. Further, materials for the spacer layer 20 and the magnetic layer 11 may be properly selected on the basis of evaluation from the above-described point of view. Specifically, it is preferable that GaN:Mg obtained by using GaN (group III–V semiconductor crystal) whose interface shape can be easily controlled and doping Mg thereto for reducing the resistance thereof is used for the spacer layer. Further, a combination with GaN:Mn is preferable for the magnetic substance layer 11 like the magnetic semiconductor layer 12a.

As described above, however, the stacked structure body of the magneto-resistance effect element according to this embodiment is not limited to a combination of GaN:Mn/GaN:Mg/GaN;Mn, but it may be properly selected and set according to various aspects described above.

As explained above, according to this embodiment, it is made easy to perform the size control on the magnetism sensitive region and it is possible to detect a micro-bit signal at a high sensitivity.

(First Modified Embodiment)

Figure 2A:
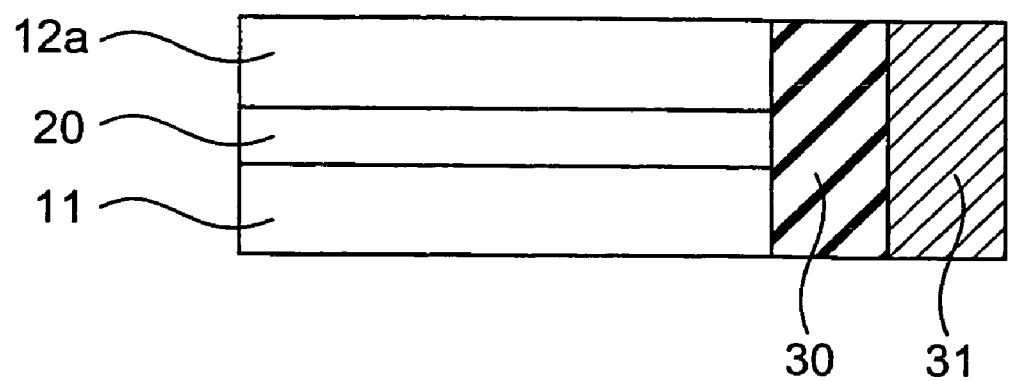
FIG. 2A is a sectional view showing a constitution of a first modified embodiment of the first embodiment.
Figure 2B:
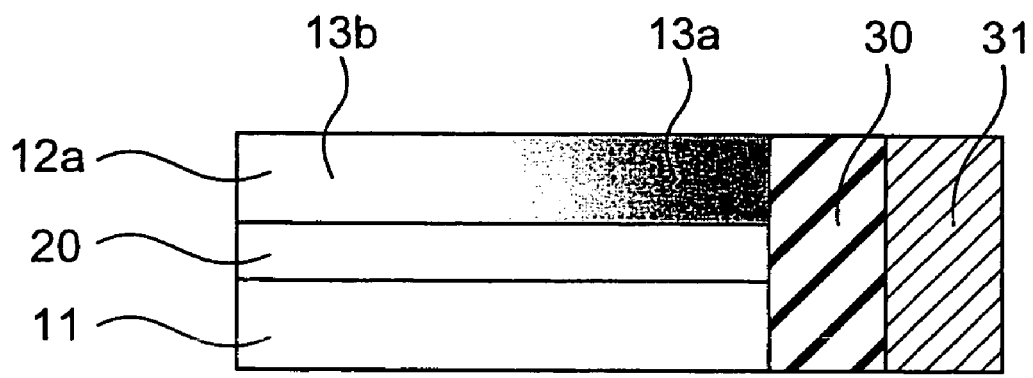
FIG. 2B is a sectional view showing a state that a voltage has been applied to a gate electrode of a magneto-resistance effect element according to the first modified embodiment.

Incidentally, in the first embodiment, such a constitution has been employed that the gate electrode 31 has been formed via the insulator layer 30 around the stacked structure body comprising the magnetic substance layer 11 and the magnetic semiconductor layer 12a stacked via the spacer layer 20. As shown in FIG. 2A, however, such a constitution may be employed that the gate electrode 31 is provided via the gate insulator layer 30 only on one side of the stacked structure body obtained by stacking the magnetic body layer 11 and the magnetic semiconductor layer 12a via the spacer layer 20. In this case, when the magnetic semiconductor layer 12a is not applied with a voltage, it is put in a paramagnetic state. FIG. 2A shows a state that a voltage is not applied to the gate electrode 31, which shows that the magnetic semiconductor 12a is in a paramagnetic state. In the magneto-resistance effect element of the first modified embodiment, by applying a negative voltage to the gate electrode as shown in FIG. 2B, conductive band electrons included in the magnetic semiconductor layer 12 are driven out to a region far from the gate electrode 31 and valence band holes are caused to approach to the gate electrode 31 to change densities of the conductive band electrons and the valence band holes. Thereby, a region 13b of the magnetic semiconductor layer 12a which has been put in the paramagnetic state is reduced and a region 13a put in the ferromagnetic state is formed in the vicinity of the gate electrode 31. That is, it is made possible to control the region size of the ferromagnetic state 13a, so that a micro-bit signal can be detected with a high sensitivity.

(Second Modified Embodiment)

Figure 3A:
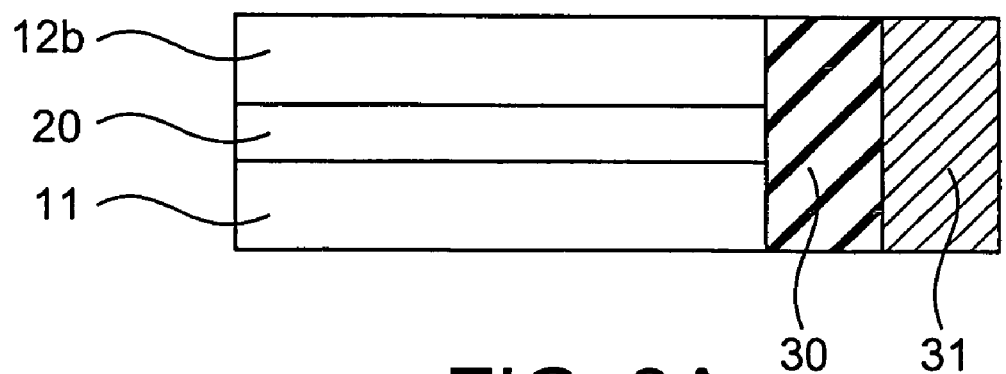
FIG. 3A is a sectional view showing a constitution of a second modified embodiment of the first embodiment.
Figure 3B:
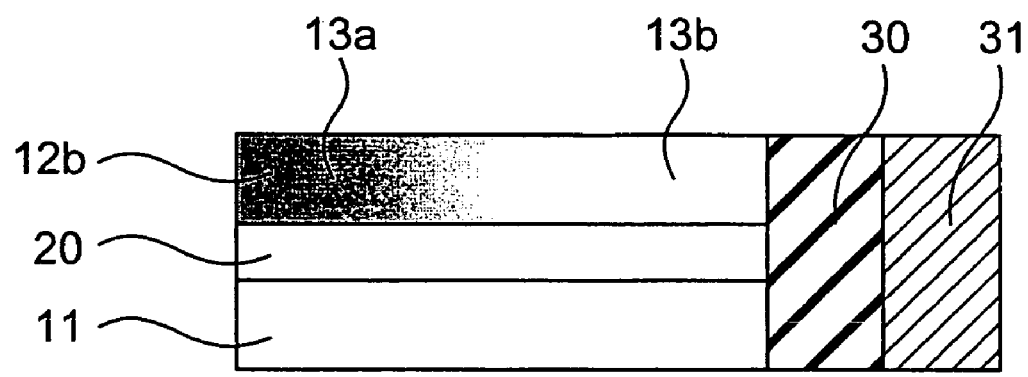
FIG. 3B is a sectional view showing a state that a voltage has been applied to a gate electrode of a magneto-resistance effect element according to the second modified embodiment.

As shown in FIG. 3A, such a constitution can be employed that the, gate electrode 31 is provided via the gate insulator layer 30 only on one side of the stacked structure body obtained by stacking the magnetic substance layer 11 comprising ferromagnetic substance and a magnetic semiconductor layer 12b via the spacer 20. In this case, when a voltage is not applied, the magnetic semiconductor layer 12b is put in a ferromagnetic state. FIG. 3A shows a state that a voltage has not been applied to the gate electrode 31, which shows the magnetic semiconductor layer 12b is put in a ferromagnetic state. In the magneto-resistance effect element of the second modified embodiment, by applying a positive voltage to the electrode as shown in FIG. 3B, valence band holes contained in the magnetic semiconductor layer 12b are driven out to a region far from the gate electrode 31 and conductive band electrons are caused to approach to the gate electrode 31 to change densities of the conductive band electrons and the valence band holes. Thereby, a region of a ferromagnetic state 13a in the magnetic semiconductor layer 12b is reduced and a region put in the ferromagnetic state 13b is formed. That is, it is possible to control the region size of the ferromagnetic state 13a, so that a micro-bit signal can be detected with a high sensitivity.

Figure 1B:
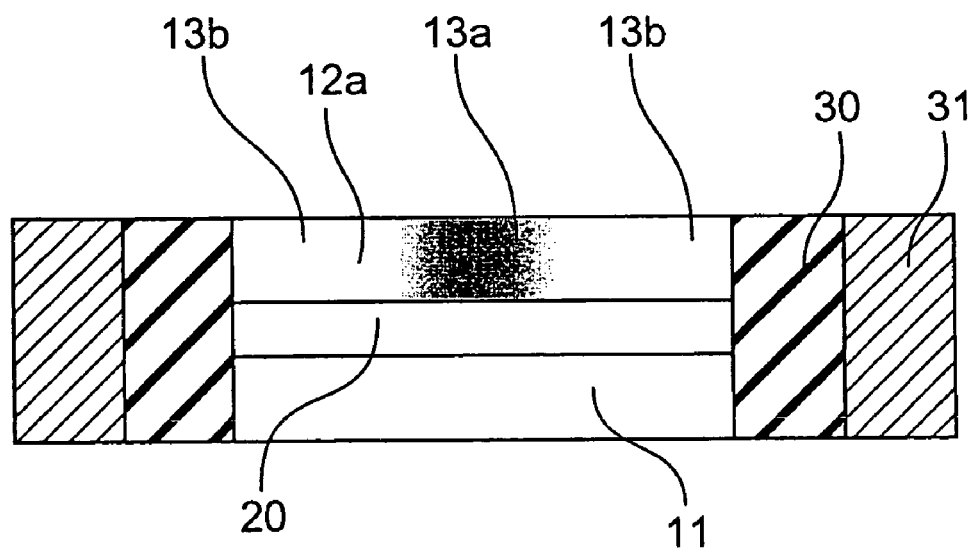
FIG. 1B is a sectional view showing a state that a voltage has been applied to a gate electrode of the magneto-resistance effect element according to the first embodiment.

Incidentally, in the second modified embodiment shown in FIGS. 3A and 3B, the gate electrode 31 has been provided only on the one side of the stacked structure body, but it may be provided on each of both sides of the stacked structure body. In this case, the region of the ferromagnetic state 13a is reduced to approximately a central portion of the magnetic semiconductor layer 12b. At this time, the region of the ferromagnetic state 13a serving as the magnetism sensitive region appears as shown in FIG. 1B.

(Second Embodiment)

Figure 4A:
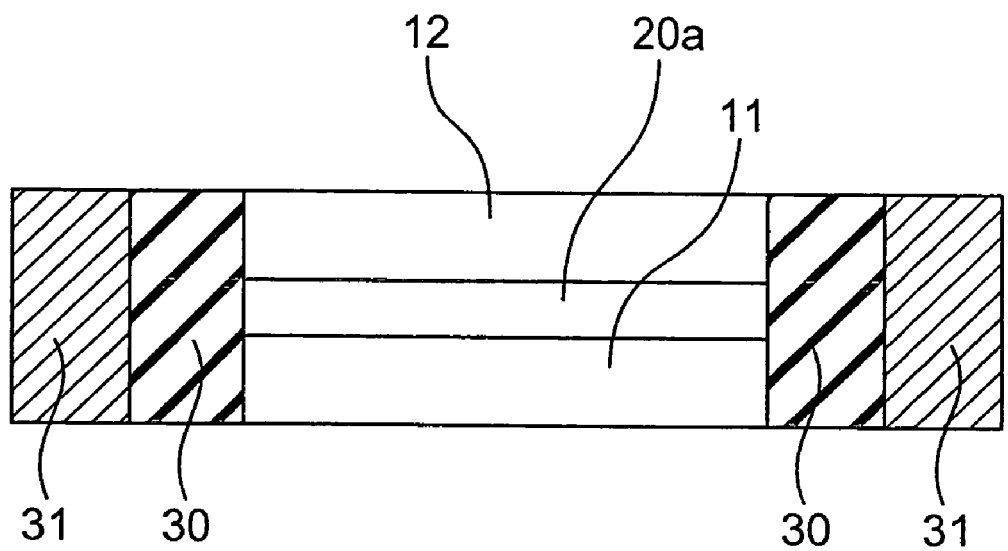
FIG. 4A is a sectional view showing a constitution of a magneto-resistance effect element according to a second embodiment of the present invention.
Figure 4B:
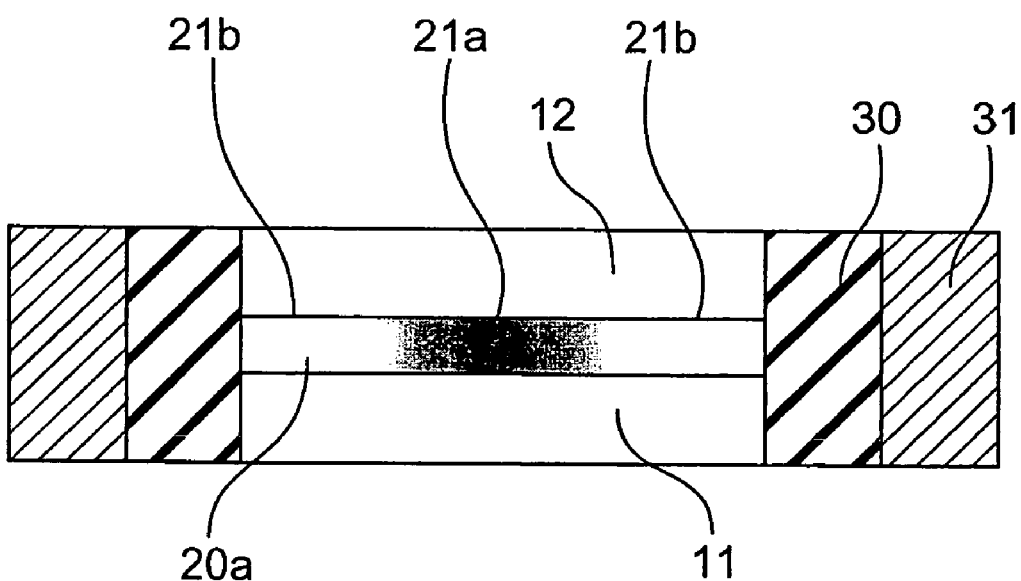
FIG. 4B is a sectional view showing a state that a voltage has been applied to a gate electrode of the magneto-resistance effect element according to the second embodiment.

Next, a magneto-resistance effect element according to a second embodiment of the present invention will be explained with reference to FIGS. 4A and 4B. A constitution of a magneto-resistance effect element according to this embodiment is shown in FIG. 4A. The magneto-resistance effect element according to this embodiment includes a stacked structure body obtained by stacking a magnetic substance layer 11 comprising ferromagnetic substance and a spacer layer 20a comprising semiconductor and a magnetic substance layer 12 comprising ferromagnetic substance, and it has a constitution that gate electrodes 31 have been provided around the stacked structure body via insulator layers 30. In such a magneto-resistance effect element with such the stacked structure body having the gate electrodes 31, such a constitution is employed that, by applying a voltage to the gate electrodes 31, densities of conductive band electrons or valence band holes contained in the spacer layer 20a are changed to control the size of a current conduction region. For example, as shown in FIG. 4B, the density of conductive band electrons or valence band holes is changed by applying a voltage to the gate electrodes 31, so that a current conduction region 21a is reduced in an electric field direction to change an electric resistance in the spacer layer 20a. Incidentally, in FIG. 4B, reference numeral 21b denotes a current non-conductive region.

That is, in the magneto-resistance effect element according to this embodiment, a conductive state is changed by applying a voltage to the gate electrodes 31. Accordingly, control on a voltage applied to the gate electrodes 31 results in control on the size of the current conductive region. Since a current does not flow in regions other than the current conductive region due to that the size of the conductive region in the magneto-resistance effect element is reduced in the electric field direction, the size of the magnetism sensitive region is reduced effectively, namely narrowed.

In the spacer layer 20a of this embodiment, semiconductor constituting a main component may be any material where a predetermined carrier density can be produced/varnished by an external electric field, from the viewpoint of the semiconductor characteristics.

Typical semiconductors include group III–V semiconductor, group II–VI semiconductor, group IV semiconductor, chalcopyrite semiconductor and amorphous semiconductor. However, since the semiconductors are just required to be capable of producing/vanishing the predetermined carrier density due to an external electric field, they are not limited to these semiconductor crystals. For example, in the group III–V semiconductor crystals, GaAs, GaN, GaP, GaSb, AlAs, AlN, AlP, AlSb, InAs, InN, InP, InSb, mixed crystals thereof and the like can be used. In the group II–VI semiconductor crystals, ZnSe, MgSe, CdSe, BeSe, ZnS, MgS, CdS, BeS, ZnTe, MgTe, CdTe, BeTe, ZnO, MgO, CdO, BeO, mixed crystals thereof and the like can be used.

In the group IV semiconductor crystals, Si, Ge, C and the like can be used. In the chalcopyrite semiconductor crystals, $CdGeP_2$, $CdSnP_2$, $CdSiP_2$, $ZnGeP_2$, $ZnSnP_2$, $ZnSiP_2$ and the like can be used. In the amorphous base semiconductor, amorphous Si, amorphous Ge, amorphous semiconductor compound and the like can be used.

Among them, GaAs, InAs, GaP, InP, InSb, GaN and mixed crystals thereof are desirable in the group III–V semiconductor, and ZnSe, CdTe, CdS, ZnO and mixed crystals thereof are desirable in the group II–VI semiconductor crystals. Further, besides these group semiconductor crystals, group VI semiconductors (Se, Te and the like), group IV–VI semiconductors (PbS, PbSe, PbTe and the like) and organic semiconductors ($C_{60}$ fullerene, anthracene, polyacetylene, polyyne and the like) can, of course, be used as long as they meet the above-described magnetic semiconductor characteristics.

In the case of this embodiment, material for the magnetic substance layers 11 and 12 may be the above-described magnetic semiconductor crystals or the ferromagnetic metals, it may be alloy or compound containing the magnetic elements explained in the first embodiment, and it is not limited to specific ones. Materials which do not destroy interface shapes between the magnetic substance layers 11 and 12, and the spacer layer 20a may be used.

Since the control of the size of the magnetism sensitive region of the magneto-resistance effect element according to this embodiment depends on the carrier density in the spacer layer 20a, the semiconductor crystal to be used is not limited to specific one, but it can be properly selected on a total evaluation from the above-described point of view. In particular, it is preferable that GaN:Mg obtained by using GaN (group III–V semiconductor crystal) whose carrier density can be controlled in a broad range and doping Mg in GaN for reducing the resistance thereof is used. Further, materials for the magnetic substance layer 11 and the magnetic substance layer 12 can be properly selected on the basis of evaluation from the above-described point of view, but it is preferable that the magnetic substance layers 11 and 12 are based upon a combination of GaN (group III–V semiconductor crystal) and the magnetic element Mn.

As described above, however, the stacked structure body of the magneto-resistance effect element according to this embodiment is not limited to a combination of GaN:Mn/GaN:Mg/GaN;Mn, but it may be properly selected and set according to various aspects described above.

As explained above, according to this embodiment, control of the size of the electric conductive region in the spacer layer 20a, namely, control of the size of the magnetism sensitive region can be conducted easily so that a micro-bit signal can be detected with a high sensitivity.

(First Modified Embodiment)

Figure 5A:
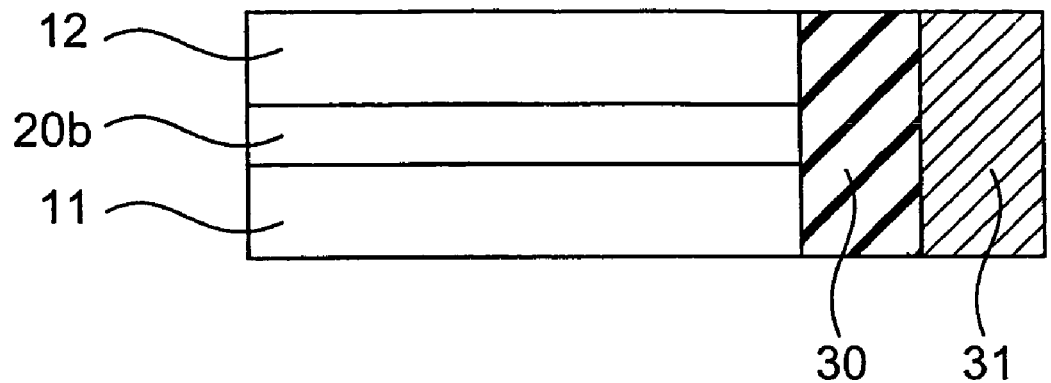
FIG. 5A is a sectional view showing a constitution of a first modified embodiment of the second embodiment.
Figure 5B:
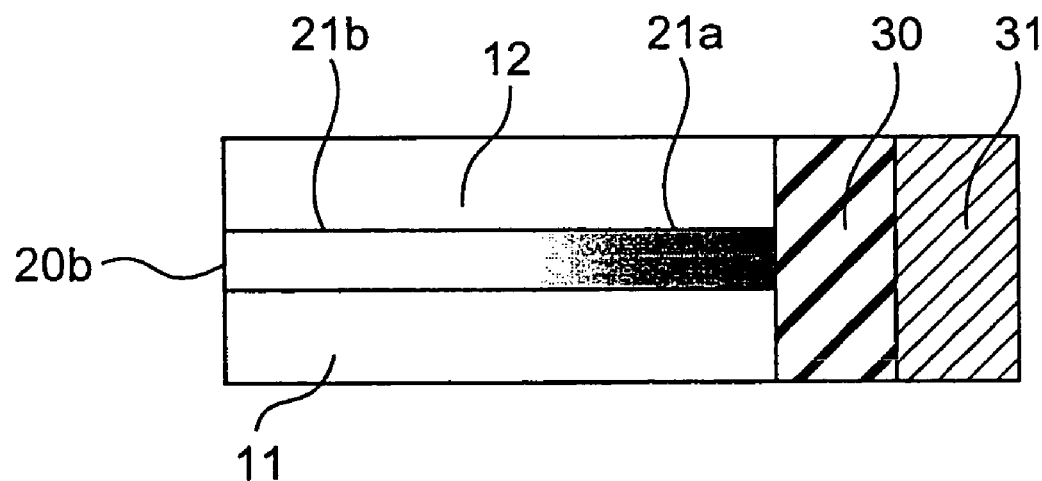
FIG. 5B is a sectional view showing a state that a voltage has been applied to a gate electrode of a magneto-resistance effect element according to the first modified embodiment of the second embodiment.

Incidentally, in the second embodiment, such a structure has been employed that the gate electrodes 31 have been formed via the insulator layers 30 on both sides of the stacked structure body obtained by stacking the magnetic substance layer 11 and the magnetic layer 12 via the spacer layer 20a comprising semiconductor. However, as shown in FIG. 5A, such a constitution can be employed that the gate electrode 31 has been provided via a gate insulator layer 30 only on one side of a stacked structure body obtained by providing a spacer layer 20b comprising semiconductor with a high resistance between a magnetic substance layer 11 and a magnetic substance layer 12. FIG. 5A shows a state that a voltage has not been applied to the gate electrode 31. At this time, the spacer layer 20b is put in a high resistance state, which shows a state where a current does not flows in the entire region of the spacer layer 20b. In the magneto-resistance effect element of the first modified embodiment, by applying a voltage to the gate electrode as shown in FIG. 5B to change the densities of conductive band electrons and valence band holes in the spacer layer 20b, an electric conductive region 21a is newly formed in the spacer layer 20b so that it is possible to control the size of the electric conductive region 21a. As a result, it is also possible to reduce the magnetism sensitive region so that a micro-bit signal can be detected with a high sensitivity.

(Second Modified Embodiment)

Figure 6A:
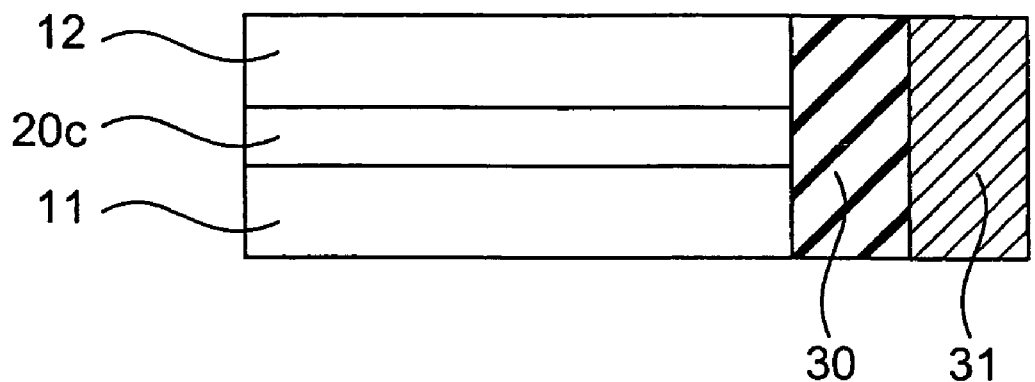
FIG. 6A is a sectional view showing a constitution of a second modified embodiment of the second embodiment.
Figure 6B:
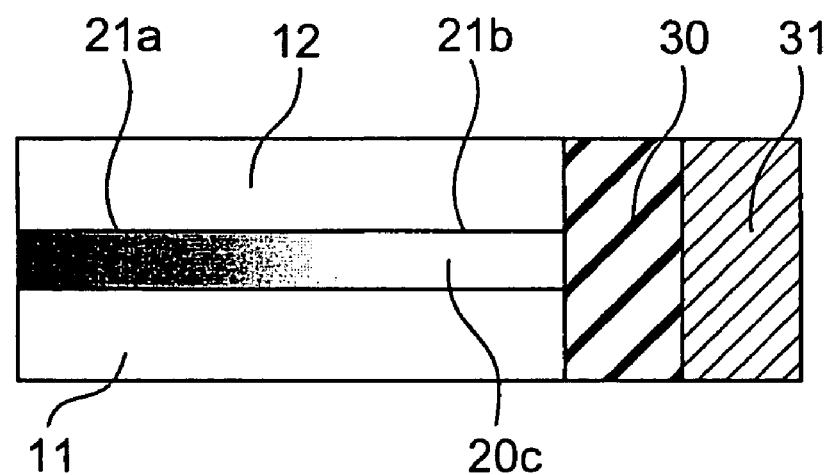
FIG. 6B is a sectional view showing a state that a voltage has been applied to a gate electrode of a magneto-resistance effect element according to the second modified embodiment of the second embodiment.

Further, as shown in FIG. 6A, such a constitution may be employed that a gate electrode 31 is provided via a gate insulator layer 30 on only one side of the stacked structure body obtained by stacking the magnetic substance layer 11 and the magnetic substance layer 12 via the spacer layer 20c comprising semiconductor. In this case, the spacer layer 20c is constituted by semiconductor which reveals a low resistance when it is not applied with a voltage. FIG. 6A shows a state that all region of the spacer layer 20c becomes an electric conductive region in a state that a voltage has been applied to the gate electrode 31. As shown in FIG. 6B, by applying a voltage to the gate electrode 31 to change the density of the conductive band electrons or the valence band holes, it is made possible to reduce the electric conductive region 21a of the spacer layer 20c to control the size of the electric conductive region 21a. As a result, it is also made possible to reduce the magnetism sensitive region so that a micro-bit signal can be detected with a high sensitivity.

As described above in the first and second embodiments, since the size control of the magnetism sensitive region using the gate electrode of the magneto-resistance effect element does not require size control made by working process, the size of the magnetism sensitive region can be made small as compared with the conventional magneto-resistance effect element.

Next, Examples of the magneto-resistance effect element according to one embodiment of the present invention will be explained with reference to FIGS. 7A to 17. Incidentally, in the following Examples, the manufacture of the magneto-resistance effect element was made according to sectional views of manufacturing steps shown in FIGS. 7A to 9C.

EXAMPLE 1

A GaN buffer layer (not shown) was first deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 constituting a magnetic free layer comprising GaN:Mn. In this process, a shutter of the metal Mn cell heated to 800° C. was opened and the magnetic semiconductor layer 12 was manufactured by supplying Ga and ammonia simultaneously. The thickness of a film deposited was 10 nm.

Next, a magneto-resistance effect film was manufactured by closing the shutter of the Mn cell, opening the shutter of the Mg cell heated to 330° C. immediately, depositing a non-magnetic layer 20 comprising GaN:Mg serving as a spacer layer up to a thickness of 4 nm, then closing the shutter of the Mg cell, opening the shutter of the metal Mn cell heated to 900° C. immediately, and depositing a magnetic semiconductor layer 11 comprising GaN:Mg up to a thickness of 10 nm. The deposit speed was about 80 nm/h.

Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect element up to a thickness of 20 nm, and an upper electrode film 44 (Ta 3 nm/Cu 20 nm/Ta 5 nm from the bottom) was further deposited thereon (refer to FIG. 7A).

Next, T-shaped mask 46 was formed on the upper electrode film 44 using a photoresist or a resist for electron beam. The width of the resist mask 46 was set to 150 nm (refer to FIG. 7B).

Figure 7A:
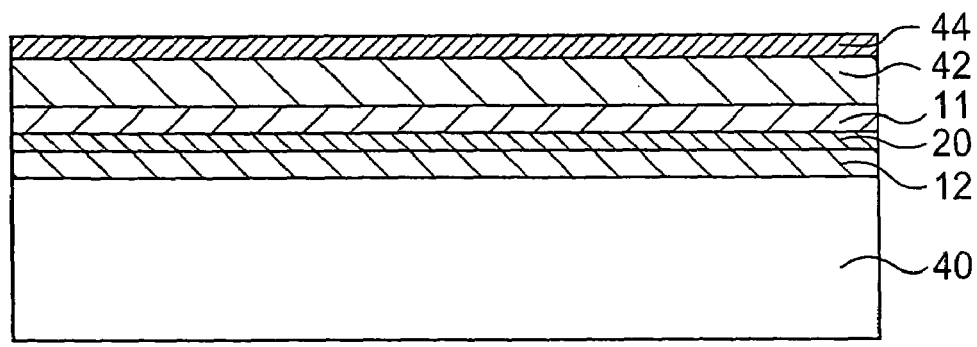
FIG. 7A to FIG. 7C are step sectional views showing manufacturing steps for a magneto-resistance effect element according to one embodiment of the present invention.
Figure 7B:
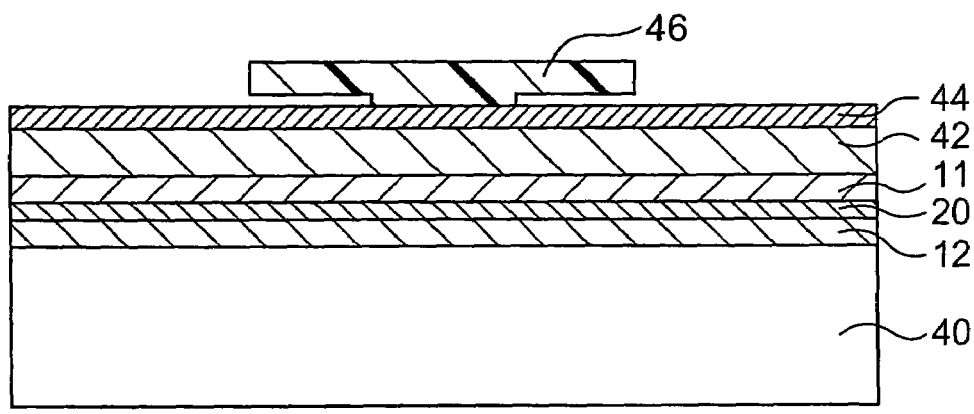
Figure 7C:
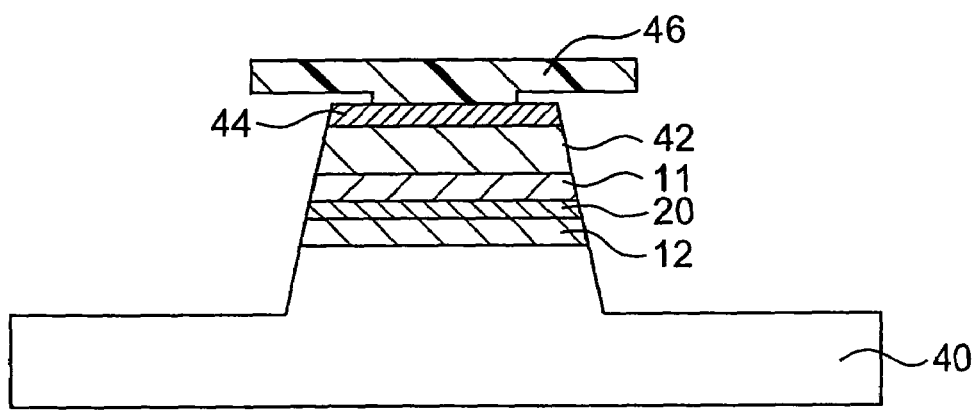

Next, the upper electrode film 44, the PtMn film 42, the magnetic semiconductor layer 11, the spacer layer 20, the magnetic semiconductor layer 12 and the substrate 40 were patterned by an ion milling via the mask 46 in a lump (refer to FIG. 7C). At this time, the reason why patterning is conducted until the substrate is etched is because a gate electrode 31 described later is formed on a side portion of the magnetic constituting a magnetic free layer (also called "a free layer") to allow application of a sufficient gate voltage.

Figure 8A:
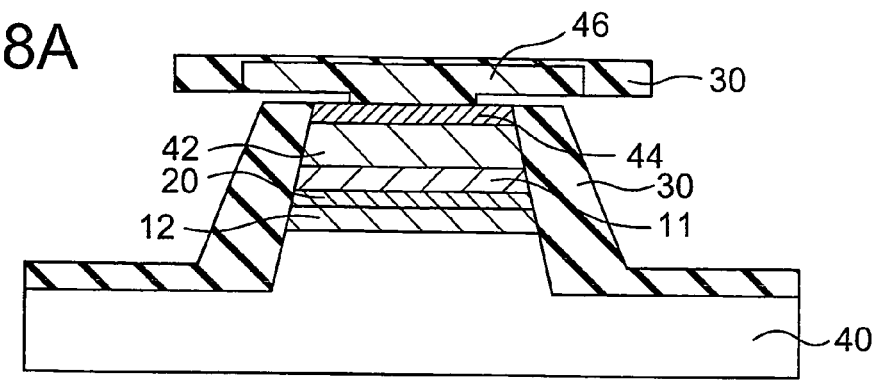
FIG. 8A to FIG. 8C are step sectional views showing manufacturing steps for a magneto-resistance effect element according to one embodiment of the present invention.
Figure 8B:
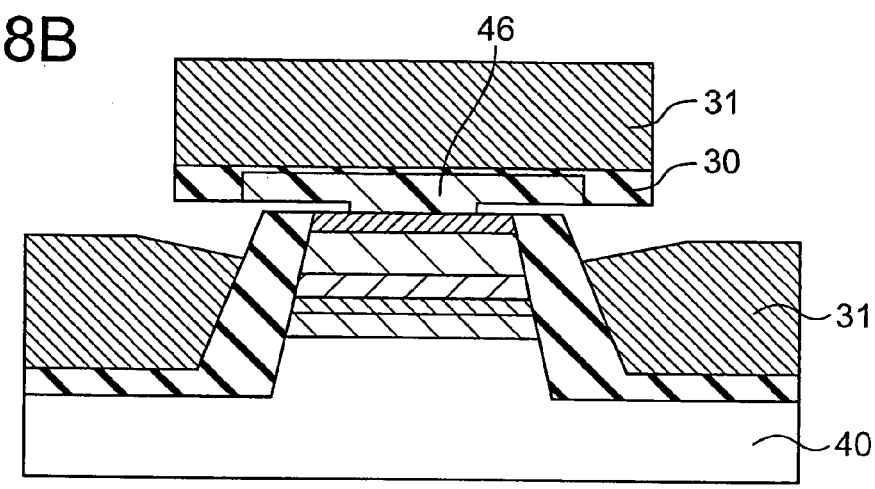
Figure 8C:
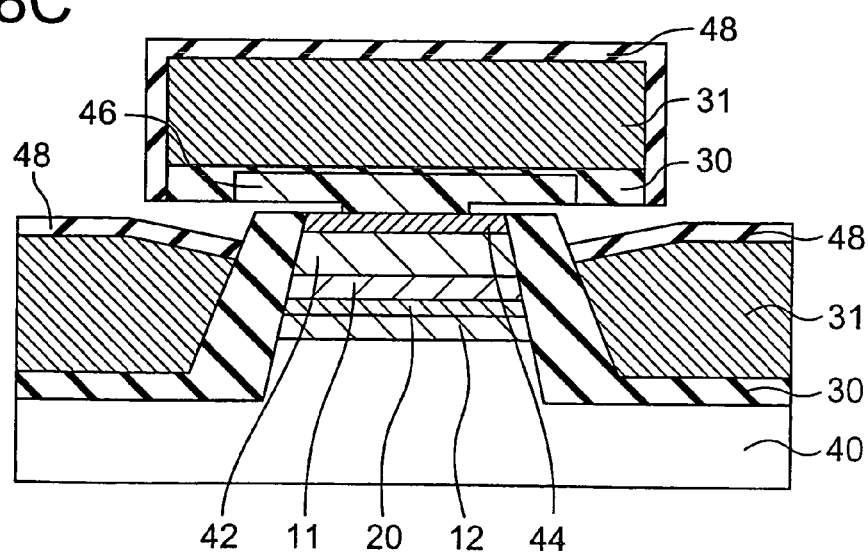

Subsequently, an insulator layer 30 comprising $SiO_2$ was deposited up to a thickness of 50 nm on side faces (four faces), in a stacking direction, of the mask from an oblique direction thereto while the mask 46 remained as it was (refer to FIG. 8A). Thereafter, a hard magnet layer 31 comprising CoPt functioning as a gate electrode film was deposited on the insulator layer 30 (four faces) up to a thickness of 100 nm (refer to FIG. 8B), and alumina film 48 was deposited up to a thickness of 20 nm (refer to FIG. 8C).

Figure 9A:
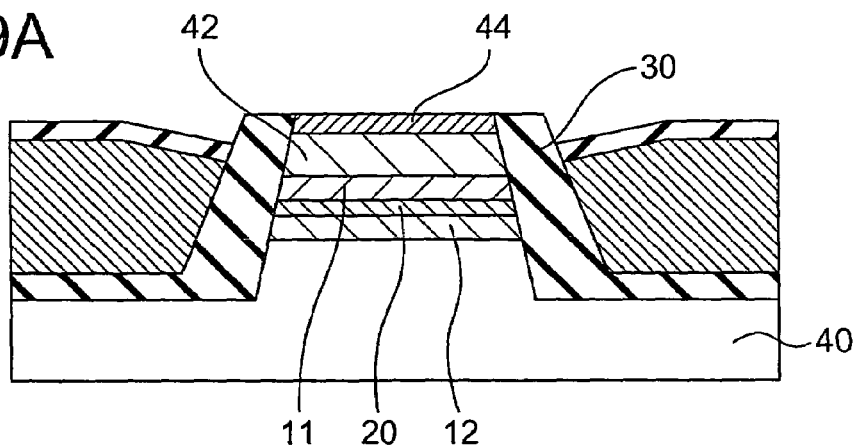
FIG. 9A to FIG. 9C are step sectional views showing manufacturing steps for a magneto-resistance effect element according to one embodiment of the present invention.
Figure 9B:
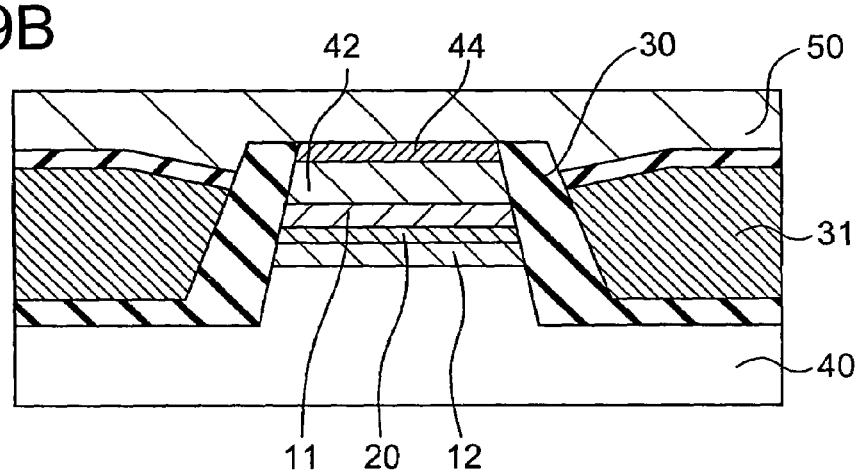
Figure 9C:
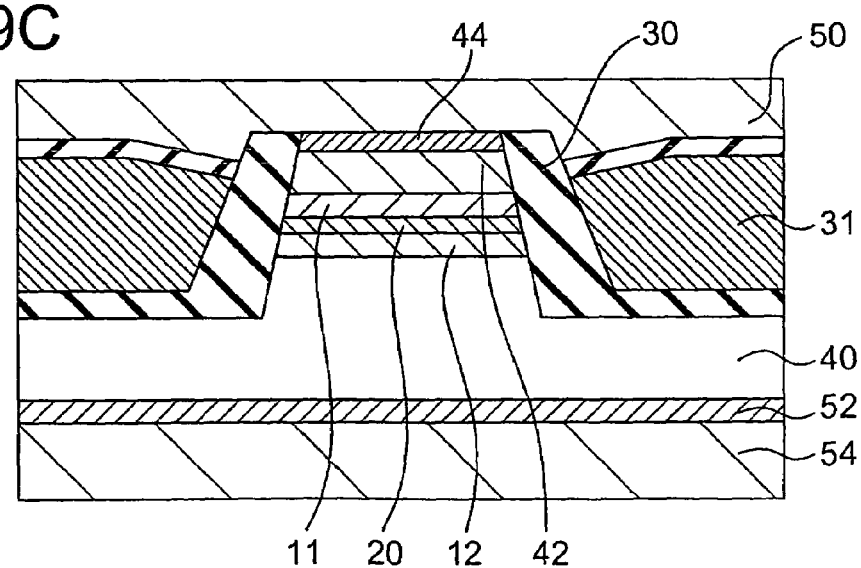

Subsequently, the mask 46 was lifted off by organic solvent (refer to FIG. 9A), an upper shield film 50 with a film thickness of 1 μm comprising NiFe was formed (refer to FIG. 9B), and a lower electrode film 52 (Ta 3 nm/Cu 20 nm/Ta 5 nm from the bottom) and a lower shield film 54 with a film thickness of 1 μm comprising NiFe were finally and sequentially deposited on the substrate 40 (refer to FIG. 9C).

Figure 10A:
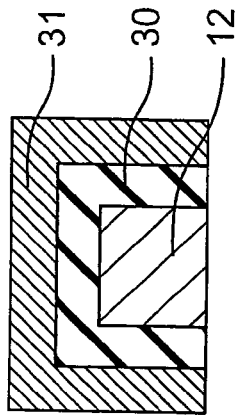
FIG. 10A to FIG. 10C are sectional views showing manufacturing steps of a portion of a magneto-resistance effect element according to one embodiment of the present invention which is positioned near a free layer thereof.
Figure 10C:
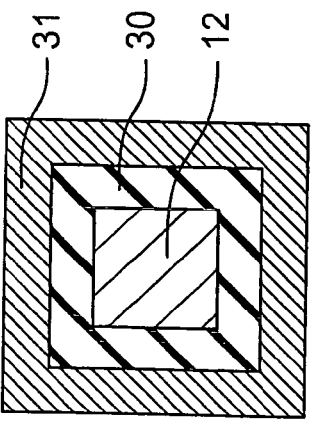
Figure 10B:
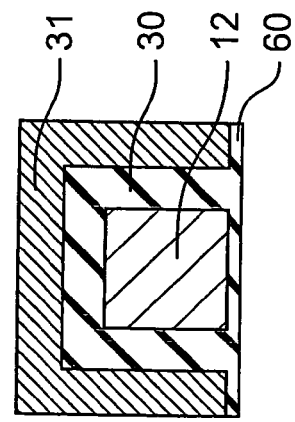
Figure 10D:
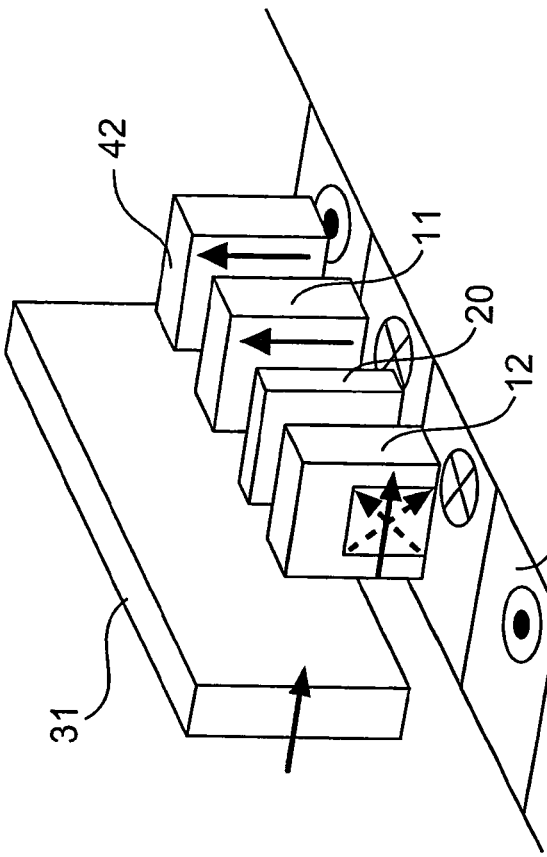
FIG. 10D is a diagram showing states of a hard bias direction, a magnetization direction of a magnetization fixed layer and a magnetization direction of a magnetization free layer.

A sectional configuration of the magneto-resistance effect element thus formed, which is positioned in the vicinity of the magnetization free layer 12, is shown in FIGS. 10A to 10C. One side face of the stacked structure (refer to FIG. 10A) was scraped off to expose a film portion of the magneto-resistance effect element (refer to FIG. 10B), and an insulator layer comprising $SiO_2$ was deposited on an exposed face so as to have a thickness of 2 nm (refer to FIG. 10C). States of a hard bias direction (only one face of a hard magnet layer 31 is shown, and the other two faces are biased in the same direction), the magnetization direction of the magnetization fixed layer 11 (which is also called "a pinned layer"), and magnetization direction of the magnetization free layer 12 to magnetization information are shown in FIG. 10D. The magnetization fixed layer 11, and the magnetization free layer 12 and the hard magnet layer 31 were set such that their magnetization directions crossed at a right angle. The magnetization direction of the magnetization fixed layer 11 is fixed by an anti-ferromagnetic layer 42.

Figure 11:
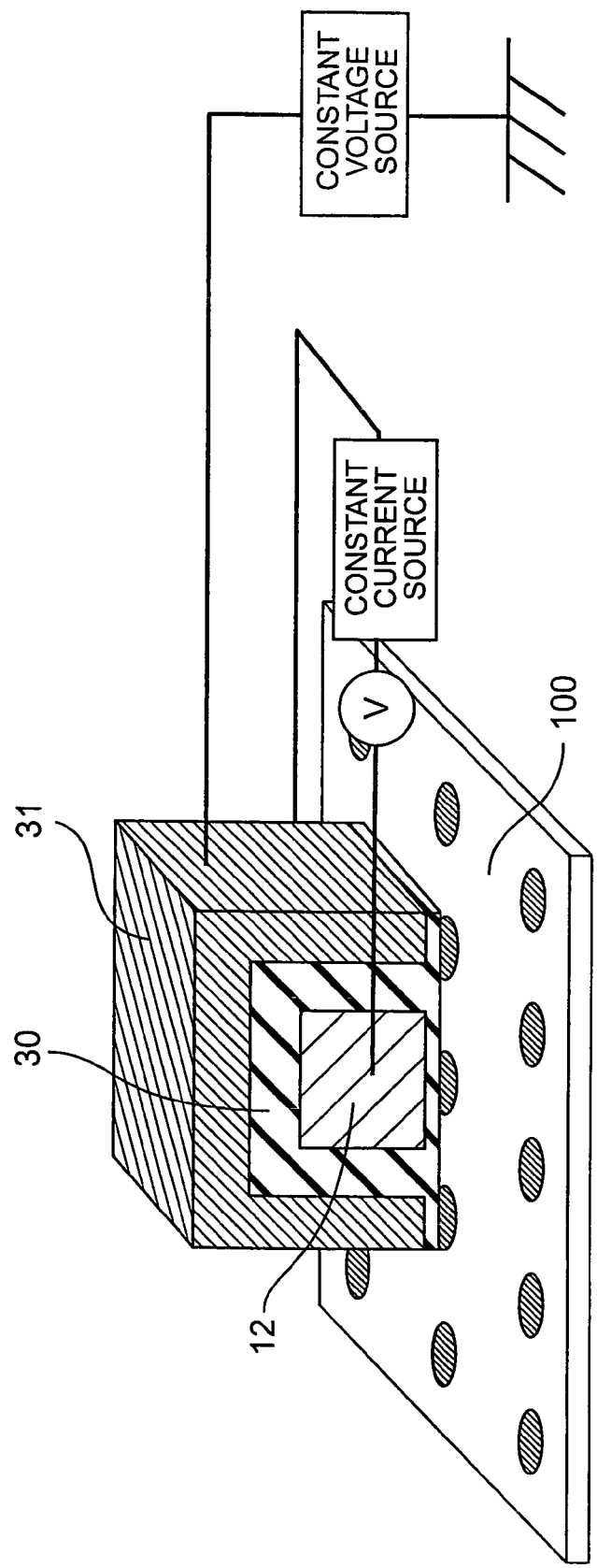
FIG. 11 is a diagram for explaining a micro-bit detection of the magneto-resistance effect element shown in FIG. 10A to FIG. 10D.

The magneto-resistance effect element was connected to a piezoelectric element movable in X-Y direction and resistance measurement between the GaN substrate 40 and the upper electrode 44 was conducted while a voltage applied to the gate electrode was being controlled, so that magnetism information observation on magnetic bits with about 10 nm dispersed was conducted (refer to FIG. 11). As a result, when a voltage was not applied to the gate electrode 31, a resolution was poor and a magnetism bit was not observed. However, a resolution change of magnetic bit stored in the magnetic medium 100 was observed in response to a voltage applied to the gate electrode 31. The magneto-resistance effect element had a resolution which could observe magnetic bit stored in the magnetic medium 100 in response to application of a voltage of +10V.

EXAMPLE 2

Like the Example 1, a GaN buffer layer was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 comprising GaN:Mn. In this process, a shutter of the metal Mn cell heated to 750° C. was opened and the magnetic semiconductor layer 12 was manufactured by supplying Ga and ammonia simultaneously. The thickness of a film deposited was 10 nm. Next, a magneto-resistance effect film was manufactured by closing the shutter of the Mn cell, opening the shutter of the Mg cell heated to 330° C. immediately, depositing a non-magnetic layer 20 comprising GaN:Mg serving as a spacer layer up to a thickness of 4 nm, then closing the shutter of the Mg cell, opening the shutter of the metal Mn cell heated to 900° C. immediately, and depositing a magnetic semiconductor layer 11 comprising GaN:Mg and constituting a magnetization fixed layer up to a thickness of 10 nm. The deposit speed was about 80 nm/h. Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect element up to a thickness of 20 nm, and an upper electrode film (Ta 3 nm/Cu 20 nm/Ta 5 nm from the bottom) 44 was further deposited thereon.

Figure 12A:
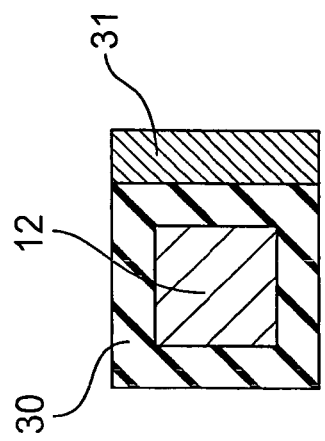
FIG. 12A to FIG. 12C are sectional views for explaining manufacturing steps of a portion of a magneto-resistance effect element according to one embodiment of the present invention which is positioned near a free layer thereof.
Figure 12B:
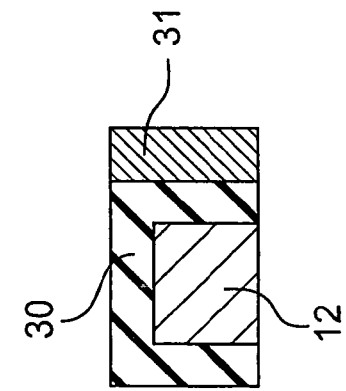
Figure 12C:
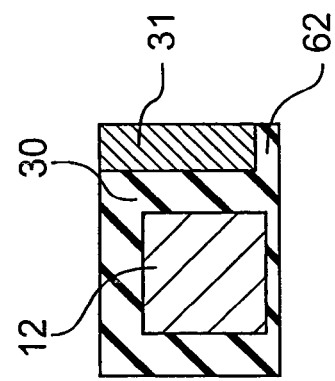

Next, a process similar to that in Example 1 was conducted so that a hard bias layer serving as the gate electrode 31 was deposited on only one surface. A sectional configuration of the structure formed in the vicinity of the magnetization free layer 12 is shown in FIG. 12A to FIG. 12C. One side face of the stacked structure (refer to FIG. 12A) was scraped off to expose the magneto-resistance effect film portion (refer to FIG. 12B), and an insulator layer 62 comprising $SiO_2$ was deposited on an exposed face so as to have a thickness of 2 nm (refer to FIG. 12C).

Figure 13:
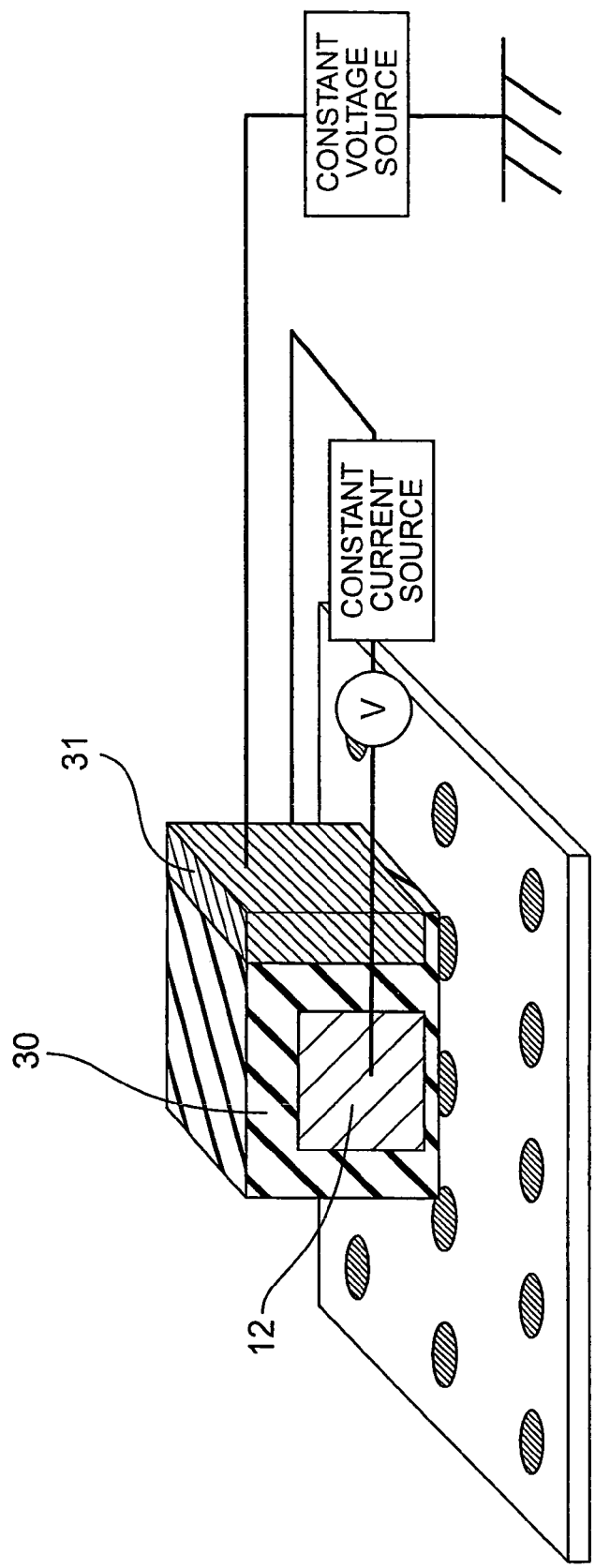
FIG. 13 is a diagram for explaining a micro-bit detection of the magneto-resistance effect element manufactured by the manufacturing steps shown in FIG. 12A to FIG. 12C.

As a result obtained by conducting measurement like Example 1, The magneto-resistance effect element had a resolution which could observe magnetic bit stored in the magnetic medium 100 in response to application of a voltage of −9V (refer to FIG. 13).

EXAMPLE 3

Like the Example 1, a buffer layer comprising GaN was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 comprising GaN:Mn. In this process, a shutter of the metal Mn cell heated to 800° C. was opened and the magnetic semiconductor layer 12 was manufactured by supplying Ga and ammonia simultaneously. The thickness of a film deposited was 10 nm. Next, a magneto-resistance effect film was manufactured by closing the shutter of the Mn cell, opening the shutter of the Mg cell heated to 330° C. immediately, depositing a non-magnetic layer 20 comprising GaN:Mg serving as a spacer layer up to a thickness of 4 nm, then closing the shutter of the Mg cell, opening the shutter of the metal Mn cell heated to 900° C. immediately, and depositing a magnetic semiconductor layer 11 comprising GaN:Mg up to a thickness of 10 nm. The deposit speed was about 80 nm/h.

Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect film up to a thickness of 20 nm, and an upper electrode film (Ta 3 nm/Cu 20 nm/Ta 5 nm from the bottom) was further deposited thereon.

Figure 14A:
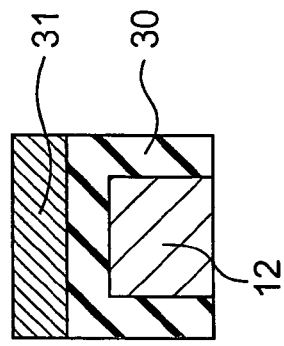
FIG. 14A to FIG. 14C are sectional views for explaining manufacturing steps of a portion of a magneto-resistance effect element according to one embodiment of the present invention which is positioned near a free layer thereof.
Figure 14B:
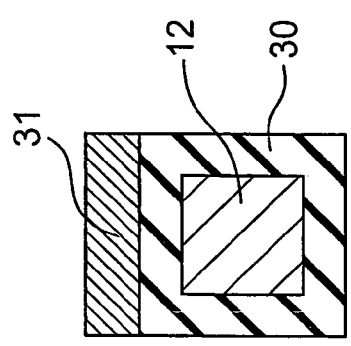
Figure 14C:
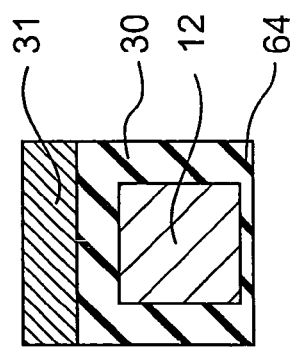

Next, a process similar to that in Example 1 was conducted so that a hard bias layer 31 serving as the gate electrode was deposited on only one surface. A sectional configuration of the structure formed in the vicinity of the free layer 12 is shown in FIG. 14A to FIG. 14C. One side face of the stacked structure (refer to FIG. 14A) was scraped off to expose the magneto-resistance effect film portion (refer to FIG. 14B), and an insulator layer 64 comprising $SiO_2$ was deposited on an exposed face so as to have a thickness of 2 nm (refer to FIG. 14C).

Figure 15:
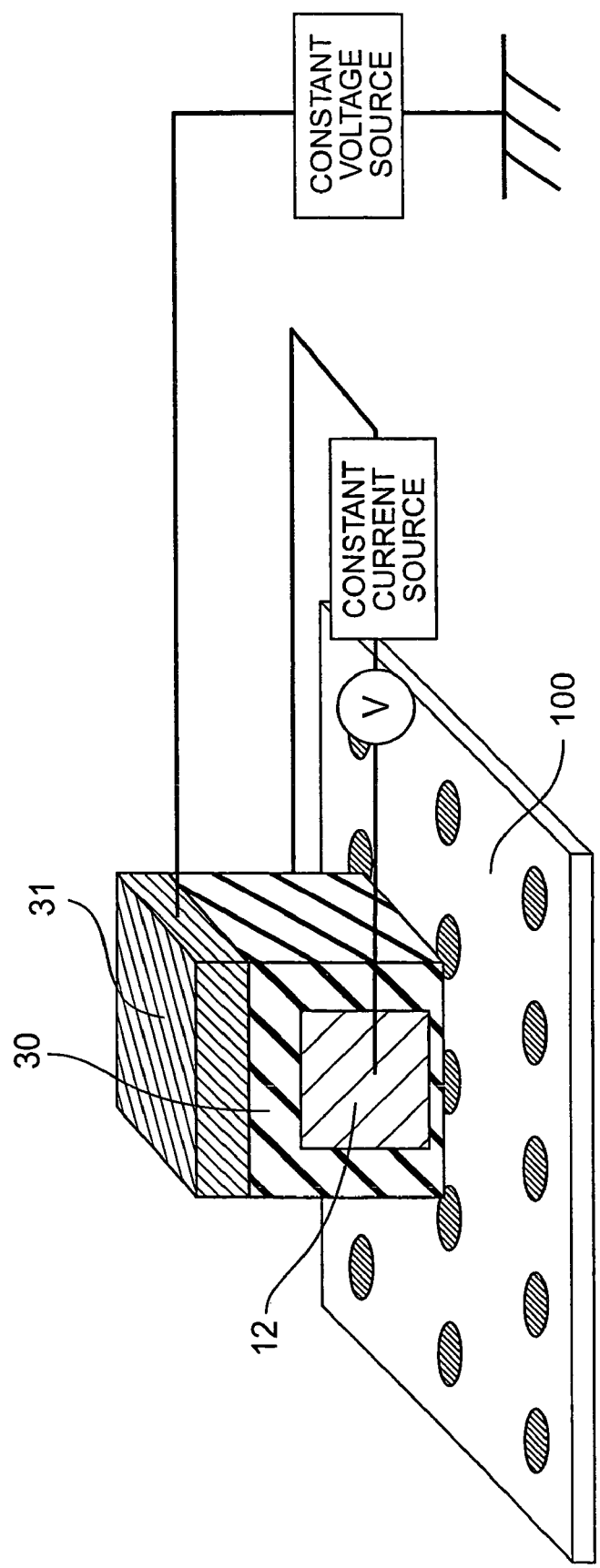
FIG. 15 is a diagram for explaining a micro-bit detection of the magneto-resistance effect element manufactured by the manufacturing steps shown in FIG. 14A to FIG. 14C.

As a result obtained by conducting measurement like Example 1, the magneto-resistance effect element had a resolution which could observe magnetic bit stored in the magnetic medium 100 in response to application of a voltage of +15V (refer to FIG. 15)

EXAMPLE 4

Like the Example 1, a GaN buffer layer was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 comprising GaN:Mn. In this process, a shutter of the metal Mn cell heated to 750° C. was opened and the magnetic semiconductor layer 12 was manufactured by supplying Ga and ammonia simultaneously. The thickness of a film deposited was 10 nm.

Next, a magneto-resistance effect film was manufactured by closing the shutter of the Mn cell, opening the shutter of the Mg cell heated to 330° C. immediately, depositing a non-magnetic layer 20 comprising GaN:Mg serving as a spacer layer up to a thickness of 4 nm, then closing the shutter of the Mg cell, opening the shutter of the metal Mn cell heated to 900° C. immediately, and depositing a magnetic semiconductor layer 11 comprising GaN:Mg up to a thickness of 10 nm. The deposit speed was about 80 nm/h. Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect element up to a thickness of 20 nm, and an upper electrode film (Ta 3 nm/Cu 20 nm/Ta 5 nm from the bottom) 44 was further deposited thereon.

Next, a process similar to that in Example 1 was conducted. A sectional configuration of the structure formed in the vicinity of the free layer 12 is shown in FIG. 16A to FIG. 16E. One side face of the stacked structure (refer to FIG. 16A) was scraped off to expose the magneto-resistance effect film portion (refer to FIG. 16B), an insulator layer 64 comprising SiO$_2$ was deposited on an exposed face so as to have a thickness of 2 nm (refer to FIG. 16C), a gate electrode film 31a comprising Ta was deposited on the insulator layer 66 to has a thickness of 5 nm (refer to FIG. 6D), and an insulator layer 68 was deposited so as to have 2 nm (refer to FIG. 16E).

Figure 17:
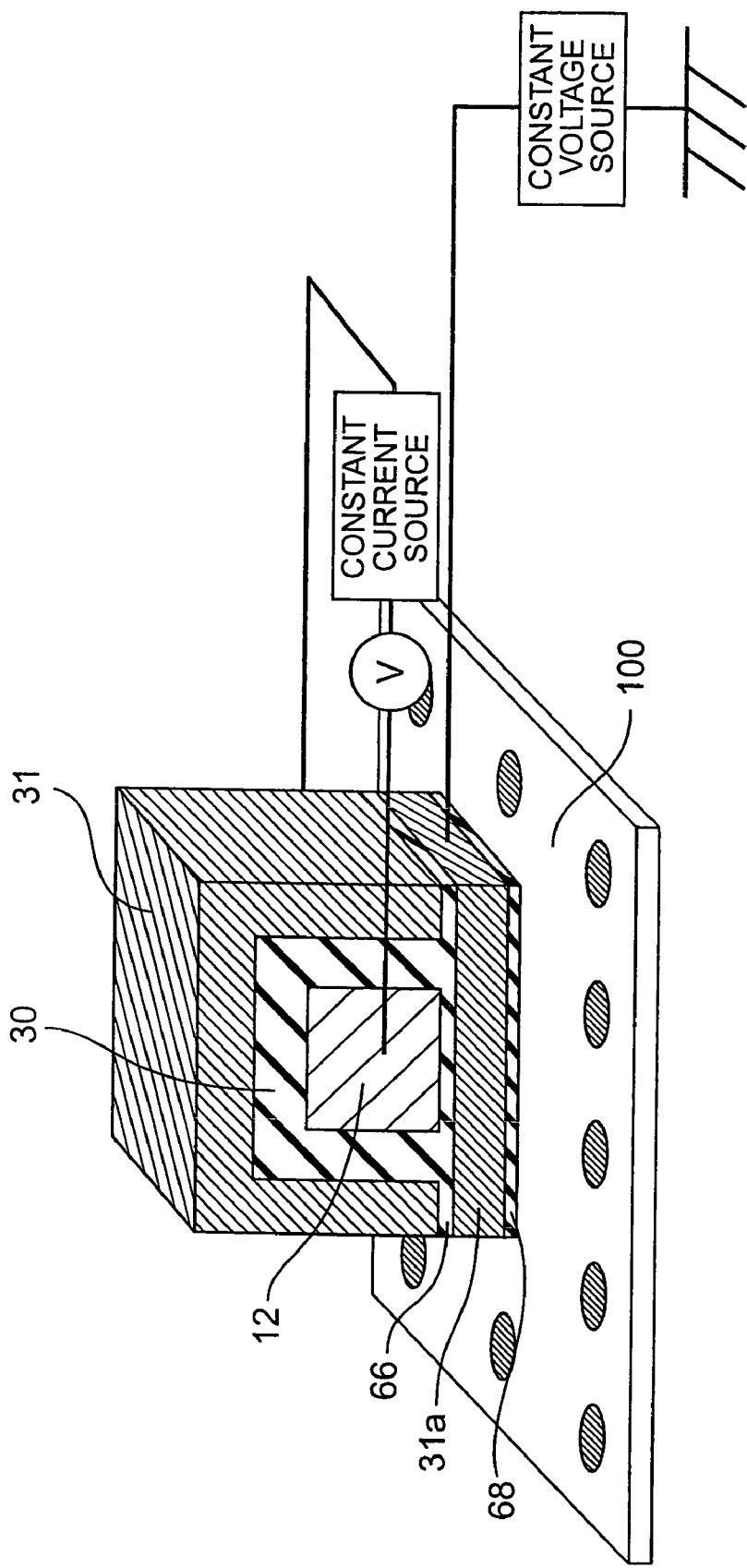
FIG. 17 is a diagram for explaining a micro-bit detection of the magneto-resistance effect element manufactured by the manufacturing steps shown in FIG. 16A to FIG. 16E.

As a result obtained by conducting measurement like Example 1, The magneto-resistance effect element had a resolution which could observe magnetic bit stored in the magnetic medium 100 in response to application of a voltage of −5V (refer to FIG. 17).

EXAMPLE 5

A GaN buffer layer was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 comprising GaN:Mn. In this process, a shutter of the metal Mn cell heated to 900° C. was opened and the magnetic semiconductor layer 12 was manufactured by supplying Ga and ammonia simultaneously. The thickness of a film deposited was 10 nm. Next, a magneto-resistance effect film was manufactured by closing the shutter of the Mn cell, opening the shutter of the Mg cell heated to 300° C. immediately, depositing a non-magnetic layer 20 comprising GaN:Mg serving as a spacer layer up to a thickness of 4 nm, then closing the shutter of the Mg cell, opening the shutter of the metal Mn cell heated to 900° C. immediately, and depositing a magnetic semiconductor layer 11 comprising GaN:Mg up to a thickness of 10 nm. The deposit speed was about 80 nm/h. Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect film up to a thickness of 20 nm, and an upper electrode film (Ta 3 nm/Cu 20 nm/Ta 5 nm from the bottom) 44 was further deposited thereon.

A process similar to that in Example 1 was performed and measurement similar to that in Example 1 was conducted. As a result, the magneto-resistance effect element had a resolution which could observe magnetic bit stored in the magnetic medium in response to application of a voltage of +13V. A schematic diagram during measurement is similar to FIG. 11.

EXAMPLE 6

A GaN buffer layer was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 ssccm without cracking. Immediately after the deposition was completed, the process proceeded to manufacturing of a magnetic semiconductor layer 12 comprising GaN:Mn. In this process, a shutter of the metal Mn cell heated to 900° C. was opened and the magnetic semiconductor layer 12 was manufactured by supplying Ga and ammonia simultaneously. The thickness of a film deposited was 10 nm. Next, a magneto-resistance effect film was manufactured by closing the shutter of the Mn cell, opening the shutter of the Mg cell heated to 270° C. immediately, depositing a non-magnetic layer 20 comprising GaN:Mg serving as a spacer layer up to a thickness of 4 nm, then opening the shutter of the metal Mn cell heated to 900° C., and immediately depositing a magnetic semiconductor layer 11 comprising GaN:Mg up to a thickness of 10 nm. The deposit speed was about 80 nm/h. Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect film up to a thickness of 20 nm, and an upper electrode film (Ta 3 nm/Cu 20 nm/Ta 5 nm from the bottom) 44 was further deposited thereon.

A process similar to that in Example 2 was performed and measurement similar to that in Example 1 was conducted. As a result, the magneto-resistance effect element had a resolution which could observe magnetic bit stored in the magnetic medium in response to application of a voltage of −10V. A schematic diagram during measurement is similar to FIG. 13.

EXAMPLE 7

A GaN buffer layer was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 comprising GaN:Mn. In this process, a shutter of the metal Mn cell heated to 900° C. was opened and the magnetic semiconductor layer 12 was manufactured by supplying Ga and ammonia simultaneously. The thickness of a film deposited was 10 nm. Next, a magneto-resistance effect film was manufactured by closing the shutter of the Mn cell, immediately opening the shutter of the Mg cell heated to 300° C., depositing a non-magnetic layer 20 comprising GaN:Mg serving as a spacer layer up to a thickness of 4 nm, then opening the shutter of the metal Mn cell, immediately opening the shutter of the metal Mn cell heated to 900° C., and depositing a magnetic semiconductor layer 11 comprising GaN:Mg up to a thickness of 10 nm. The deposit speed was about 80 nm/h. Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect film up to a thickness of 20 nm, and an upper electrode film (Ta 3 nm/Cu 20 nm/Ta 5 nm from the bottom) was further deposited thereon.

A process similar to that in Example 3 was performed and measurement similar to that in Example 1 was conducted. As a result, the magneto-resistance effect element had a resolution which could observe magnetic bit stored in the magnetic medium in response to application of a voltage of −18V. A schematic diagram during measurement is similar to FIG. 15.

EXAMPLE 8

A GaN buffer layer was deposited by annealing a doped substrate 40 comprising GaN:Mg at 800° C. for 30 minutes and decreasing the temperature of the substrate to 700° C. after annealing in a molecular beam epitaxy apparatus using ammonia as a nitrogen source. A metal Ga cell temperature at this time was 900° C. and ammonia was flowed at a rate of 5 sccm without cracking. Immediately after the deposition was completed, the process proceeded to manufacturing of a magnetic semiconductor layer 12 comprising GaN:Mn. In this process, a shutter of the metal Mn cell heated to 900° C. was opened and the magnetic semiconductor layer 12 was manufactured by supplying Ga and ammonia simultaneously. The thickness of a film deposited was 10 nm. Next, a magneto-resistance effect film was manufactured by closing the shutter of the Mn cell, immediately opening the shutter of the Mg cell heated to 270° C., depositing a non-magnetic layer 20 comprising GaN:Mg serving as a spacer layer up to a thickness of 4 nm, then opening the shutter of the metal Mn cell heated to 900° C., and immediately depositing a magnetic semiconductor layer 11 comprising GaN:Mg up to a thickness of 10 nm. The deposit speed was about 80 nm/h. Thereafter, the substrate was taken out from the molecular beam epitaxy apparatus. In a sputtering apparatus, an anti-ferromagnetic layer 42 comprising PtMn for fixing magnetization of the magnetization fixed layer 11 was deposited on the magneto-resistance effect film up to a thickness of 20 nm, and an upper electrode film 44(Ta 3 nm/Cu 20 nm/Ta 5 nm from the bottom) was further deposited thereon.

A process similar to that in Example 4 was performed and measurement similar to that in Example 1 was conducted. As a result, the magneto-resistance effect element had a resolution which could observe magnetic bit stored in the magnetic medium in response to application of a voltage of −7V. A schematic diagram during measurement is similar to FIG. 17.

EXAMPLE 9

Figure 18:
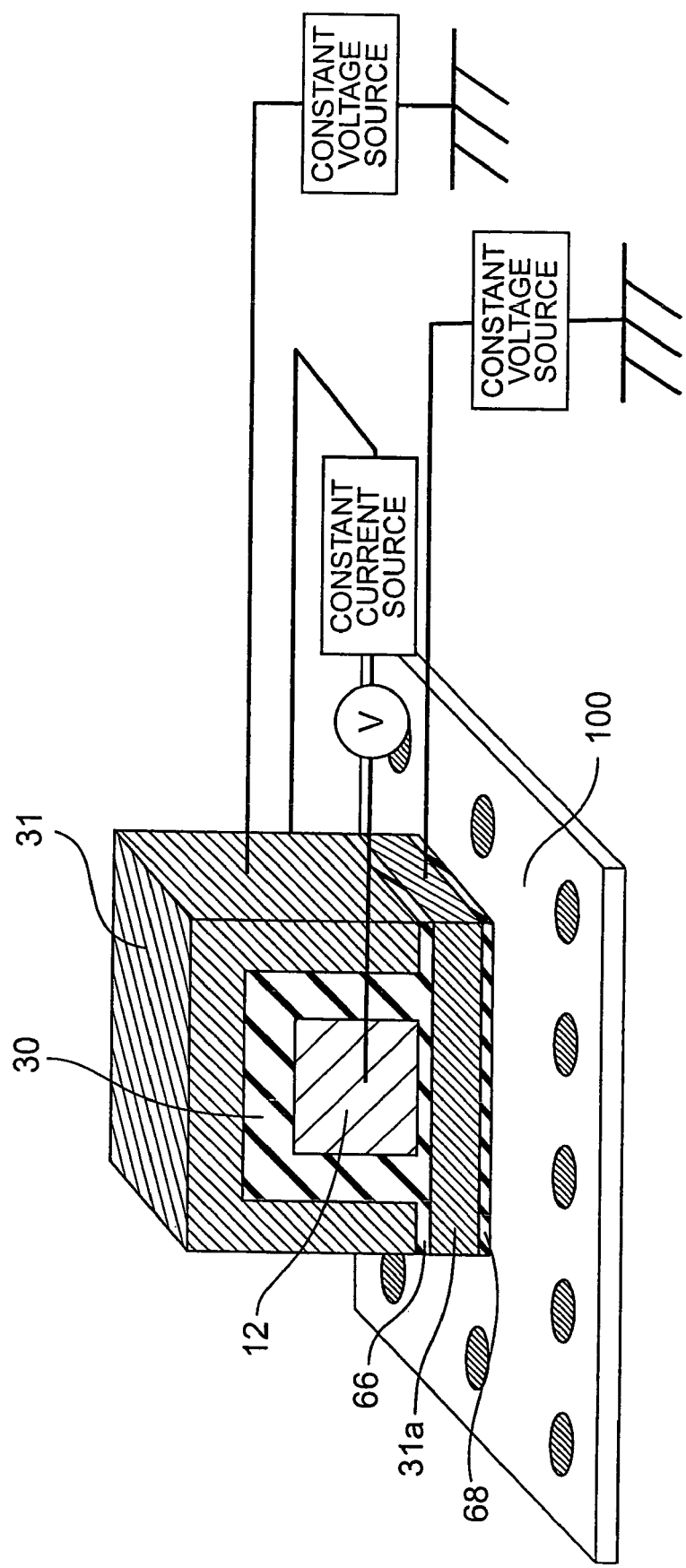
FIG. 18 is a diagram for explaining a micro-bit detection of Examples 9 and 10.

As shown in FIG. 18, measurement was conducted in a similar manner to Example 1 in a state that the hard bias layer 11 of Example 4 was applied with +1V and the gate electrode 31a was applied with −5V. As a result, the magneto-resistance effect element had a resolution that which could observe magnetic bit stored in the magnetic medium.

EXAMPLE 10

Measurement was conducted in a similar manner to Example 1 in a state that the hard bias layer 11 of Example 4 was applied with +13V and the gate electrode 31a was applied with −7V in the same manner as the case of the measurement in Example 9 shown in FIG. 18. As a result, the magneto-resistance effect element had a resolution that which could observe magnetic bit stored in the magnetic medium.

Incidentally, In the above-described Example 1 to Example 10, the magnetic substance layer 11 constituting the magnetization fixed layer was provided on the upper electrode 44 side and the magnetic substance layer 12 constituting the magnetization free layer was provided on the lower electrode 52 side, but such a constitution can be employed that the magnetic substance layer 11 constituting the magnetization fixed layer is provided on the lower electrode 52 side and the magnetic substance layer 12 constituting the magnetization free layer is provided on the upper electrode 44 side.

As described above, according to the present invention, a micro-bit signal can be detected with a high sensitivity.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A magneto-resistance effect element comprising:
   a first magnetic substance layer;
   a spacer layer stacked on the first magnetic substance layer;
   a second magnetic substance layer stacked on the spacer layer;
   an insulating layer positioned adjacent to a stacked structure comprising the first magnetic substance layer, the spacer layer and the second magnetic substance layer;
   a gate electrode positioned adjacent to the insulating layer, and
   a magnetism sensitive region controlled by a voltage applied to the gate electrode.

2. The magneto-resistance effect element according to claim 1, wherein the size of the magnetism sensitive region of at least one of the first and second magnetic substance layers is changed by the voltage applied to the gate electrode.

3. The magneto-resistance effect element according to claim 2, wherein the magnetism sensitive region is narrowed.

4. The magneto-resistance effect element according to claim 2, wherein the magnetic substance layer whose magnetism sensitive region is changed by the voltage applied to the gate electrode includes at least one of group III–V semiconductor crystal, group II–VI semiconductor crystal, group IV semiconductor crystal, chalcopyrite semiconductor crystal and amorphous semiconductor crystal as a base material, and includes at least one of a transition metal element and a rare earth metal element as a magnetic element.

5. The magneto-resistance effect element according to claim 1, wherein the first magnetic substance layer is formed of magnetic semiconductor, and the first magnetic substance layer is put in a paramagnetic state when a voltage is not applied to the gate electrode and the magnetism sensitive region to be put in a ferromagnetic state appears in the first magnetic substance layer when a voltage is applied to the gate electrode.

6. The magneto-resistance effect element according to claim 5, wherein the gate electrode is provided on each of a pair of side portions of the stacked structure opposed to each other, and the magnetism sensitive region appears at an approximately central portion of the first magnetic substance layer when a voltage is applied to the gate electrode.

7. The magneto-resistance effect element according to claim 5, wherein the gate electrode is provided on one of a pair of side portions of the stacked structure opposed to each other, and the magnetism sensitive region appears at an end region of the first magnetic substance layer which is positioned on a side of the gate electrode.

8. The magneto-resistance effect element according to claim 1, wherein the first magnetic substance layer is formed of magnetic semiconductor, and the first magnetic substance layer is put in a ferromagnetic state when a voltage is not applied to the gate electrode, and a magnetism sensitive region which is put in the ferromagnetic state is narrowed when a voltage is applied to the gate electrode.

9. The magneto-resistance effect element according to claim 8, wherein the gate electrode is provided on each of a pair of side portions of the stacked structure opposed to each other, and the magnetism sensitive region appears at an approximately central portion of the first magnetic substance layer when a voltage is applied to the gate electrode.

10. The magneto-resistance effect element according to claim 8, wherein the gate electrode is provided on one of a pair of side portions of the stacked structure opposed to each other, and the magnetism sensitive region appears at an end region of the first magnetic substance layer which is positioned on a side of the gate electrode.

11. The magneto-resistance effect element according to claim 4, wherein the magnetic substance layer where the magnetism sensitive region is changed comprises either one of GaAs, GaN, GaP, GaSb, AlAs, AlN, AlP, AlSb, InAs, InN, InP, and InSb when the base material is group III–V semiconductor crystal.

12. The magneto-resistance effect element according to claim 4, wherein the magnetic substance layer where the magnetism sensitive region is changed comprises either one of ZnSe, MgSe, CdSe, BeSe, ZnS, MgS, CdS, BeS, ZnTe, MgTe, CdTe, BeTe, ZnO, MgO, CdO, and BeO when the base material is group II–VI semiconductor crystal.

13. The magneto-resistance effect element according to claim 4, wherein the magnetic substance layer where the magnetism sensitive region is changed comprises either one of $CdGeP_2$, $CdSnP_2$, $CdSiP_2$, $ZnGeP_2$, $ZnSnP_2$, $ZnSiP_2$, $CdGeAs_2$, $CdSnAs_2$, $CdSiAs_2$, $ZnGeAs_2$, $ZnSnAs_2$, $ZnSiAs_2$, $CuAlS_2$, $CuGaS_2$, $CuInS_2$, $AgAlS_2$, $AgGaS_2$, $AgInS_2$, $CuAlSe_2$, $CuGaSe_2$, $CuInSe_2$, $AgAlSe_2$, $AgGaSe_2$, $AgInSe_2$, $CuAlTe_2$, $CuGaTe_2$, $CuInTe_2$, $AgAlTe_2$, $AgGaTe_2$, and $AgInTe_2$, when the base material is chalcopyrite semiconductor crystal.

14. The magneto-resistance effect element according to claim 1, wherein the size of an electric conductive region of the spacer layer is changed by a voltage applied to the gate electrode.

15. The magneto-resistance effect element according to claim 14, wherein the conductive region is narrowed.

16. The magneto-resistance effect element according to claim 14, wherein the spacer layer is formed of group III–V semiconductor crystal, group II–VI semiconductor crystal, group IV semiconductor crystal, chalcopyrite semiconductor crystal or amorphous semiconductor crystal.

17. The magneto-resistance effect element according to claim 14, wherein the spacer layer is a semiconductor layer and a resistance value of the spacer layer obtained when a voltage is not applied to the gate electrode is higher than a resistance value thereof obtained when a voltage is applied to the gate electrode.

18. The magneto-resistance effect element according to claim 14, wherein the spacer layer is a semiconductor layer and a resistance value of the spacer layer obtained when a voltage is not applied to the gate electrode is lower than a resistance value thereof obtained when a voltage is applied to the gate electrode.

19. The magneto-resistance effect element according to claim 14, wherein the gate electrode is provided on at least one side of the stacked structure.

* * * * *